(12) United States Patent
Baudet et al.

(10) Patent No.: US 6,703,701 B2
(45) Date of Patent: Mar. 9, 2004

(54) SEMICONDUCTOR DEVICE WITH INTEGRATED CIRCUIT ELEMENTS OF GROUP III-V COMPRISING MEANS FOR PREVENTING POLLUTION BY HYDROGEN

(75) Inventors: Pierre Baudet, Yerres (FR); Peter Frijlink, Yerres (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 58 days.

(21) Appl. No.: 09/412,261

(22) Filed: Oct. 5, 1999

(65) Prior Publication Data

US 2003/0071339 A1 Apr. 17, 2003

(30) Foreign Application Priority Data

Oct. 6, 1998 (FR) .............................. 98 12497

(51) Int. Cl.[7] .............................................. H01L 23/48
(52) U.S. Cl. ........................................ 257/682; 257/678
(58) Field of Search ............................ 257/682, 678, 257/758

(56) References Cited

U.S. PATENT DOCUMENTS 4,769,345 A * 9/1988 Butt et al. ................. 437/217
5,491,361 A * 2/1996 Stupian et al. ............. 257/680
5,614,785 A * 3/1997 Wallace et al. ............. 315/496
5,861,665 A * 1/1999 Derkits, Jr. et al. ......... 257/682
6,027,986 A * 2/2000 Conte et al. ................ 438/471
6,037,001 A * 3/2000 Kaloyeros et al. .......... 427/250
6,066,196 A * 5/2000 Kaloyeros et al. ......... 106/1.18
6,066,868 A * 5/2000 Evans, Jr. ................... 257/295
6,110,807 A * 8/2000 Conte et al. ................ 438/471

FOREIGN PATENT DOCUMENTS

| EP | 0513894 B1 | 11/1992 |
| JP | 59208860 A | 11/1984 |
| JP | 64207266 A | 3/1991 |

* cited by examiner

Primary Examiner—John B. Vigushin
Assistant Examiner—Lourdes Cruz
(74) Attorney, Agent, or Firm—Aaron Waxler

(57) ABSTRACT

A semiconductor device comprising integrated circuit elements realized by means of a stack of layers of semiconductor materials provided on a substrate of semiconductor material and comprising means for preventing the pollution of the circuit elements and of the substrate by hydrogen originating from their environment is characterized in that said means are formed by a layer of a material which absorbs hydrogen (or hydrogen getter) (10), which forms a pattern which is integrated with the circuit elements and whose outer surface (11) is exposed and in contact with the environment. This device, of the MMIC type, forms part of a module of a spatial or terrestrial telecommunication system.

7 Claims, 2 Drawing Sheets

SEMICONDUCTOR DEVICE WITH INTEGRATED CIRCUIT ELEMENTS OF GROUP III-V COMPRISING MEANS FOR PREVENTING POLLUTION BY HYDROGEN

FIELD OF THE INVENTION

The invention relates to a semiconductor device comprising integrated circuit elements realized in a stack of layers on a substrate and comprising means for preventing pollution of the circuit elements and of the substrate by hydrogen originating from their environment.

The invention finds its application in the semiconductor manufacturing industry, including the manufacture of integrated circuits which are incorporated in hermetically sealed modules such as transmission modules used in the field of telecommunications.

BACKGROUND OF THE INVENTION

A semiconductor device comprising means for preventing the pollution of circuit elements by hydrogen is known from patent application JP no. 64-207266 of Oct. 8, 1989 published Mar. 27, 1991 (FUJITSU LTD.; TAKAYUKI OBA). This patent application describes means for preventing the hydrogen from diffusing into the semiconductor substrate, thus improving the reliability of a semiconductor device. These means consist of a layer which absorbs the hydrogen contained in insulating layers.

The use of these means involves the realization of a composite film comprising a metal layer made of a metal which absorbs the hydrogen, forming a hydride, arranged in sandwich fashion between two insulating layers of silicon nitride (SiN). This composite film is deposited on the upper surface of a semiconductor device which comprises a substrate and a circuit element formed on said substrate. The insulating layer, which contains nitrogen (N), such as the silicon nitride (SiN) layer, contains much hydrogen. The metal layer which is sandwiched between the insulating layers absorbs this hydrogen. A suitable metal for absorbing the hydrogen is palladium. For example, the composite film is formed by the metal layer of palladium sandwiched between two layers of silicon nitride. The result of this is that the hydrogen present within a protective insulating layer formed at the upper surface of the semiconductor device and the hydrogen present within an intermediate insulating layer can be captured by the sandwiched metal layer. The diffusion of the hydrogen into the substrate is thus suppressed and the generation of hot electrons in the substrate can be reduced to a minimum.

SUMMARY OF THE INVENTION

It is an object of the invention to provide means for eliminating the hydrogen originating more in particular from the environment of an integrated semiconductor device when this semiconductor device is protected by a housing. It is known to those skilled in the art that the metal parts of protective housings of "chips" or integrated semiconductor devices are subject to aging, during which they evolve especially hydrogen. If the semiconductor device is realized on a substrate of a material from group III–V, for example gallium arsenide, the hydrogen will react with the substrate material and act as a neutralizer of charges, either at the surface or inside the material itself. If the semiconductor device comprises a stack of epitaxial layers and one of these materials is from the group III–V, the hydrogen will act as a charge neutralizer at the interfaces of the layers or inside the layers. The diffusion of hydrogen thus has a major detrimental effect on the surface charges, the interface charges, and on the doping profiles of the substrate and the layers.

This phenomenon is generally referred to as hydrogen poisoning. Its effect may become apparent at temperatures of the order of 100° C. and higher. It should be borne in mind that the operational standards in the field of integrated circuits may demand that the circuits operate at temperatures of up to 125° C., or even up to 200 or 300° C. without any deterioration in performance, depending on the envisaged application. In particular, a circuit included in a module which is launched in a telecommunication satellite must be capable of operating at temperatures of the order of 300° C. It is found that from the moment when a semiconductor device of the type described above is enclosed in a protective housing, this semiconductor device exhibits a deterioration in its performance within a very short time, of the order of a few hundred hours, or even just a few hours, depending on the temperature at which it is made to operate. Experiments have shown that the use of a metal layer made of a hydrogen-absorbing metal sandwiched between two insulating layers so as to form a composite film covering the integrated circuits has a detrimental influence on the integrated circuit because this composite film constitutes a strong parasitic capacitance which downgrades the performance levels of all elements of the integrated circuit even at room temperature. Such a layer realized in accordance with the cited patent application should accordingly be steered clear of altogether.

The cited document teaches that the hydrogen originates from the insulating layers themselves. Experiments have accordingly been carried out for verifying the presence of this problem and these experiments have shown that the effect produced thereby is negligible. Indeed, it is the hydrogen originating from the environment of the semiconductor device, and in particular from the housing, which has a very important detrimental effect.

According to the invention, this detrimental effect is suppressed by means of a device provided with means for preventing pollution of the circuit elements via a layer of material which absorbs hydrogen and which forms a pattern integrated with the circuit elements.

An advantage of the device according to the invention is that the detrimental effect of the hydrogen on the integrated circuit elements is no longer present once this device has been enclosed in a housing. The deterioration in performance of the integrated circuits can no longer be observed in time. It follows from this that the hydrogen contained in the integrated circuit itself is not the major factor of deterioration as taught in the cited patent application. But whatever the cause, the means according to the invention also solve the problem known from the cited patent application.

BRIEF DESCRIPTION OF THE DRAWINGS

The invention will now be explained in more detail below with reference to the annexed diagrammatic Figures, in which.

DESCRIPTION OF PREFERRED EMBODIMENTS

The invention relates to an integrated semiconductor device comprising circuit elements realized in a stack of layers on a substrate made from materials from the chemical group III–V. These groups III–V materials lose their electrical properties in a few hours if present in an environment containing hydrogen and at a temperature higher than room temperature.

The invention provides means integrated with the circuit elements on the substrate for eliminating the hydrogen from the environment.

The expression "hydrogen from the environment" is understood to mean the hydrogen which is enclosed together with the integrated circuit device inside a hermetically sealed protective housing. The hydrogen present in said environment originates essentially from metal elements of the housing, which degasses in the course of time owing to aging or to the temperature which is higher than room temperature.

The expression "temperature higher than room temperature" is understood to mean any temperature, for example, lying between 30° C. and 300° C. which may arise when the device is used in a system launched in a satellite, or used on earth for telecommunication purposes. In general, the operating temperature will be of the order of 100° C. to 250° C.

Under these conditions, it was found that the hydrogen in question does not originate from parts of the integrated circuits or from insulating layers of the integrated circuit to any appreciable degree, but on the contrary from degassing of metal parts or other parts of the housing, and that this degassing takes place even if the housing had already been degassed before use.

According to the invention, a layer portion of a material which absorbs hydrogen is provided on a region of the surface of the integrated circuit. This layer portion, which may have any shape as desired, is realized in the regions without circuit elements, for example between circuit elements, or alternatively peripheral to the integrated circuits, taking into account manufacturing tolerances which define the distances between the circuit elements.

Palladium (Pd) is a metal which has given the best results as a hydrogen-absorbing material up to the present day. It is by no means impossible, however, that those skilled in the art will find other materials or metals which have equally good properties. In that case, these materials or metals may be used as palladium is here. Titanium (Ti), on its own or in combination with palladium (Pd) is also known to give satisfactory results. Generally, materials comprising palladium or materials comprising titanium, or both, may be favorably used for realizing a hydrogen getter.

Figure 1A:
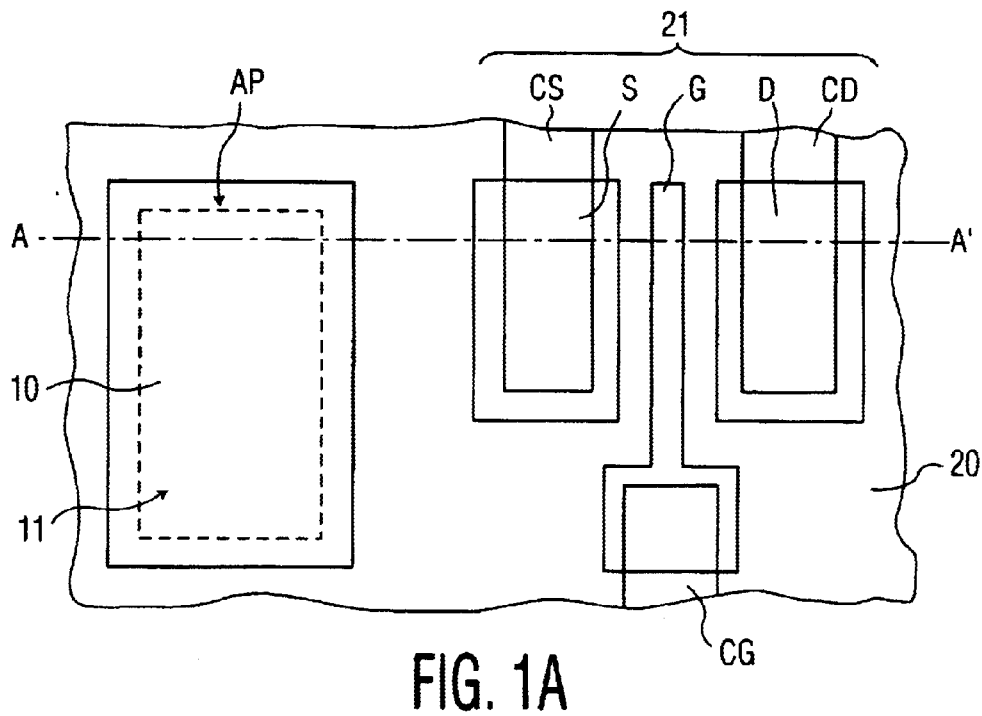
FIG. 1A is a plan view of a semiconductor device with an example of an integrated circuit element on a substrate provided with a hydrogen getter.

FIG. 1A shows an example of an embodiment of a semiconductor device, in plan view, with an integrated circuit element 21 and a pattern 10 of a material which absorbs hydrogen. The integrated circuit element 21 is a field effect transistor with a gate G, a source S, and a drain D. The pattern 10 of the material which absorbs hydrogen is a rectangle. This pattern, however, may have any shape whatsoever so as to be accommodated between the circuit elements.

Figure 1B:
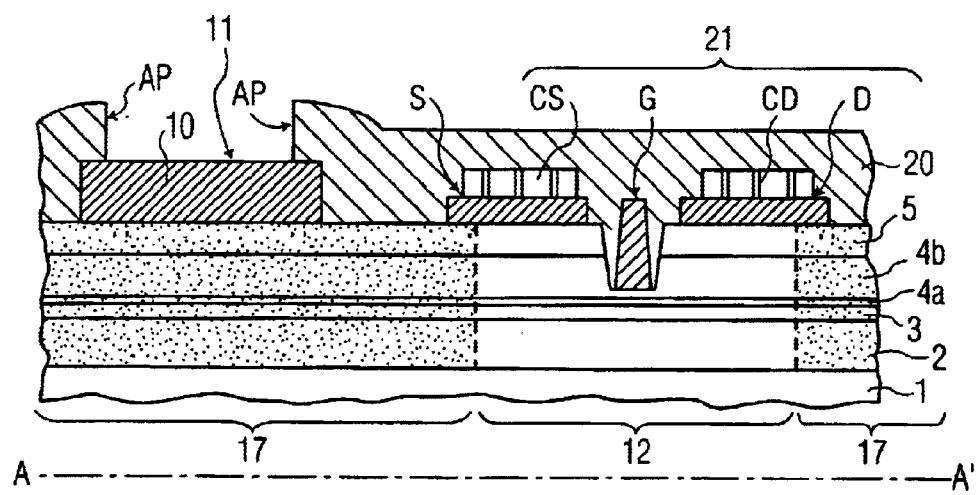
FIG. 1B shows the device of FIG. 1 in cross-section.

FIG. 1B shows the same semiconductor device in cross-section taken on the line AA' in FIG. 1A. The semiconductor device comprises a stack of layers 2 to 5 of group III–V material realized on a substrate 1 of gallium arsenide (GaAs). The stack of layers comprises regions 17 for lateral insulation of a circuit element from other circuit elements, and at least one active region 12 for realizing a circuit element which in the example given here is a PHEMT (Pseudomorphic High Electron Mobility Transistor) or pseudomorphic HEMT.

Figure 2A:
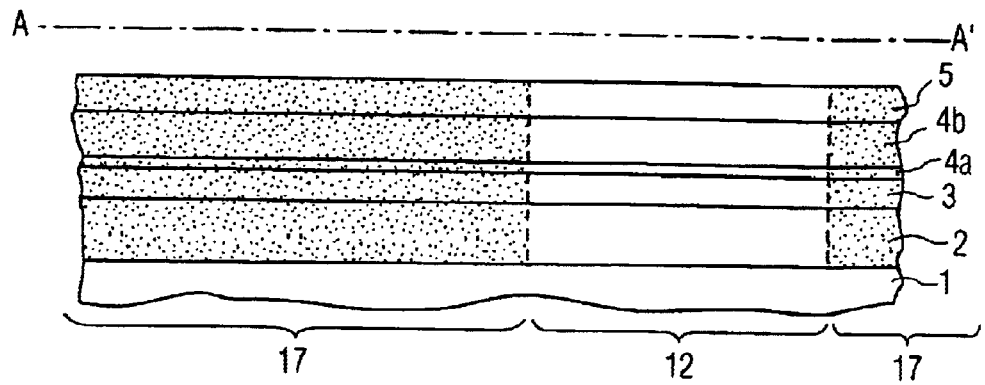
FIGS. 2A, 2B, 2C illustrate steps in a process for the manufacture of a hydrogen getter included in an integrated circuit of a semiconductor device.

FIG. 2A shows a stack of epitaxial layers realized on a semi-insulating substrate 1 made of GaAs for the realization of a PHEMT, by way of non-limitative example. This stack comprises, starting from the substrate: a buffer layer 2 of undoped GaAs with a thickness of the order of 0.5 to 1 $\mu$m; two mutually adjoining layers which form a heterostructure, i.e. having different forbidden bandwidths or gaps, with the layer 3 of InGaAs which is not doped, has the smaller forbidden bandwidth, and has a thickness of the order of 10 to 15 nm, and with the layer 4a, 4b of AlGaAs which is n$^+$ doped and has a thickness of approximately 20 to 50 nm; and then a covering layer 5 of n$^+$ doped GaAs with a thickness of approximately 20 to 50 nm. The layer 4a, 4b forms an etch stop layer with respect to the layer 5.

In a step following the realization of the layers, an ion implantation is carried out in the zones 17 so as to define the active region 12.

Figure 2B:
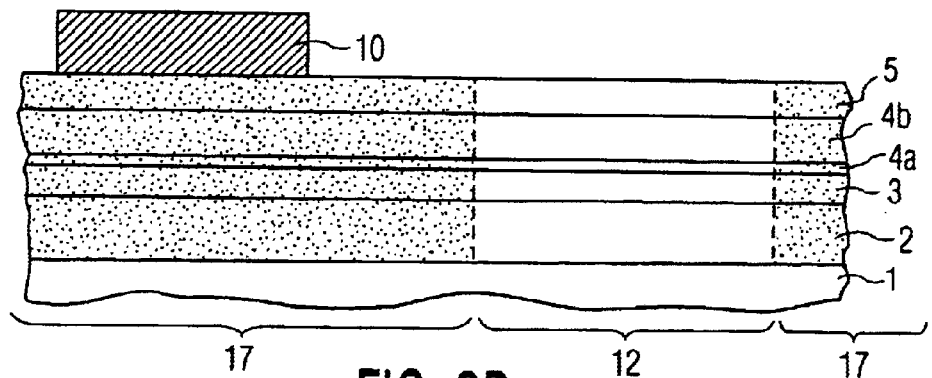

In FIG. 2B, a layer 10, for example made of palladium, is now realized so as to form the hydrogen-absorbing pattern in the given shape (for example, a rectangle between two transistors).

Figure 2C:
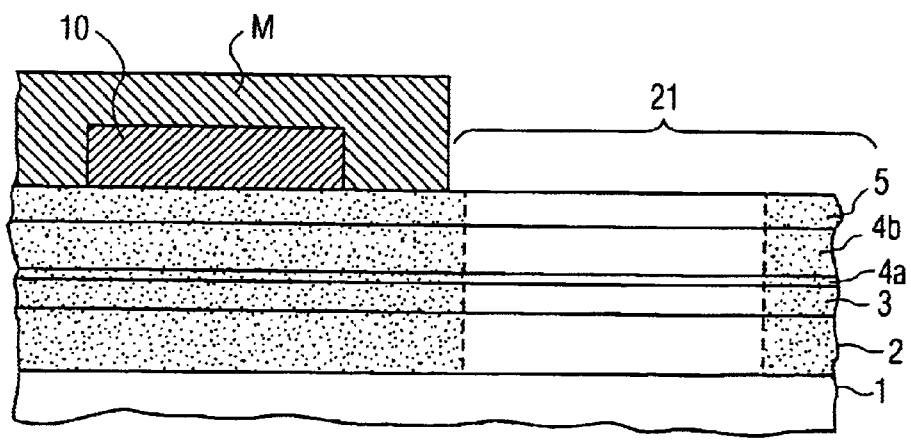

In FIG. 2C, the pattern is now protected by a mask M of a material which renders it possible to realize the transistor in region 21 by standard methods known to those skilled in the art and which may be eliminated once the transistor has been completed.

In FIG. 1B, the mask M protecting the pattern 10 has been removed after completion of the transistor 21, and the assembly of the semiconductor device is covered with a protective layer, which may be made of silicon oxide (SiO$_2$) or silicon nitride (SiN).

FIG. 1B, which corresponds to FIG. 1A, shows that the gate G, the drain D, and the source S are covered by conducting layers CG, CD, and CS, respectively, called contacts of the second level and serving to connect said electrodes G, D, S to other elements of the integrated circuit.

According to the invention, a protective layer 20 covers the entire integrated circuit, but it is very important that it should comprise an opening AP for exposing the upper surface 11 of the layer 10 of hydrogen-absorbing material.

The integrated circuit provided with the layer 10 for absorbing hydrogen does not have the disadvantage that it introduces parasitic capacitance's, as in the device described with reference to the prior art. Once the semiconductor device has been enclosed in its protective housing, it is found that the deteriorations in performance, which manifest themselves before the type of hydrogen getter formed by the layer 10 according to the invention has been applied, do not arise any longer. This appears to prove that the real problem is indeed caused by the presence of hydrogen in the environment of the semiconductor device and not by the quantity of hydrogen present in the layers of the integrated circuit itself, the latter quantity being certainly negligible.

The manufacture of MMIC transistors or circuit elements realized by means of materials of group III–V often involves the use of palladium for separating aluminum (Al) layers from gold (Au) layers because aluminum and gold are incompatible. The realization of a palladium layer 10 as a hydrogen getter in that case will not necessitate an additional manufacturing step: it is sufficient to reserve the location for the palladium pattern 10 and subsequently to realize this pattern simultaneously with the Al/Au separating layers. The layer 10 is therefore not necessarily formed directly on the substrate. The sole requirement is that its upper surface 11 must be exposed.

Palladium has the characteristic that it absorbs approximately 900 times its own volume of hydrogen, forming a compound Pd$_2$H. The presence of a layer 10 of palladium of a sufficiently great surface area and thickness accordingly prevents the hydrogen originating from the environment of the circuit from affecting the small quantity of palladium which is involved in the process of manufacturing MMIC transistors made from group III–V materials. In addition, the presence of the layer 10 forming the hydrogen getter prevents the neutralization of charges in the III–V layers or at the interfaces thereof.

The device comprising one or several integrated circuits as described above is encapsulated in a housing. The housing is preferably hermetically closed.

This device may form part of a spatial telecommunication module or system launched in an artificial satellite, or alternatively in a terrestrial telecommunication module or system.

The integrated circuits may form transmission/reception circuits, amplifiers, phase shifters, or any other circuits used in the modules of telecommunication systems. Generally, these circuits operate at high and microwave frequencies and are called MMICs (Monolithic Microwave Integrated Circuits).

What is claimed is:

1. A semiconductor device comprising integrated circuit elements realized in a stack of layers on a substrate and comprising means for preventing pollution of the circuit elements and of the substrate by hydrogen originating from an environment inside a housing enclosing a portion of the semiconductor device, characterized in that said means are formed by a layer of a material which absorbs hydrogen, referred to as hydrogen getter (10), which forms a pattern which is integrated with the circuit elements and of which an external surface (11) is exposed and in contact with said environment.

2. A device as claimed in claim 1, characterized in that the hydrogen getter layer is formed on a surface of the substrate and in that the circuit elements comprise an upper protective layer which has an opening for exposing the upper surface (11) of said hydrogen getter layer (10).

3. A device as claimed in claim 1, characterized in that the hydrogen getter layer is realized simultaneously with a layer of a same material from which elements of the integrated circuits are formed, and in that the circuit elements comprise an upper protective layer which has an opening for exposing the upper surface (11) of said hydrogen getter layer (10).

4. A device as claimed in claim 1, characterized in that the hydrogen getter layer forms patterns arranged between the integrated circuit elements or patterns arranged along a periphery of the integrated circuits.

5. A device as claimed in claim 1, characterized in that the semiconductor materials belong to the chemical group III–V.

6. A device as claimed in claim 1, characterized in that the material of the hydrogen getter layer comprises palladium (Pd).

7. A device as claimed in claim 1, characterized in that the material of the hydrogen getter layer comprises titanium (Ti).

* * * * *